US005581837A

United States Patent [19]
Uchiyama et al.

[11] Patent Number: 5,581,837
[45] Date of Patent: Dec. 10, 1996

[54] BRUSH CLEANING APPARATUS AND CLEANING SYSTEM FOR DISK-SHAPED OBJECTS USING SAME

[75] Inventors: Isao Uchiyama; Masami Nakano; Hiroyuki Takamatu; Morie Suzuki, all of Fukushima-ken, Japan

[73] Assignee: Shin-Etsu Handotai Co., Ltd., Tokyo, Japan

[21] Appl. No.: 493,070

[22] Filed: Jun. 21, 1995

[30]     Foreign Application Priority Data

Jul. 4, 1994  [JP]  Japan ................................ 6-151874

[51] Int. Cl.⁶ ........................... A47L 25/00; A46B 13/02
[52] U.S. Cl. ................... 15/77; 15/88.3; 15/97.1; 15/102; 15/302
[58] Field of Search ............. 15/77, 88.3, 97.1, 15/102, 302, 306.1, 308, 309.2; 134/57 R, 902

[56]             References Cited

U.S. PATENT DOCUMENTS

| 2,962,741 | 12/1960 | Petrillo | ..................... 15/77 |
| 3,939,514 | 2/1976 | Cook. | |
| 4,208,760 | 6/1980 | Dexter et al. | ..................... 15/309.2 |
| 5,081,733 | 1/1992 | Kudo | ..................... 15/77 |
| 5,317,778 | 6/1994 | Kudo et al. | ..................... 15/77 |

FOREIGN PATENT DOCUMENTS

| 0526245A1 | 2/1993 | European Pat. Off. . | |
| 2488157 | 2/1982 | France | ..................... 15/88.3 |
| 0122262 | 10/1978 | Japan | ..................... 15/77 |
| 1646628 | 5/1991 | U.S.S.R. | ..................... 15/77 |

OTHER PUBLICATIONS

IBM, Technical Disclosure Bulletin, vol. 17, No. 2, Jul. 1974, (Carufe).

*Primary Examiner*—David Scherbel
*Assistant Examiner*—Randall E. Chin
*Attorney, Agent, or Firm*—Barnes & Thornburg

[57]     ABSTRACT

A brush cleaning apparatus which includes at least one brush cleaning means having a pair of rotary brushes that are arranged in parallel one above the other. Disk-shaped objects are transported one at a time between the brushes so as to be cleaned thereby. A stopper is provided in front of the disk-shaped objects. The stopper selectively blocks movement of the disk-shaped objects and releases the disk-shaped objects for controlled movement of the disk-shaped objects through the cleaning apparatus.

15 Claims, 6 Drawing Sheets

BRUSH CLEANING APPARATUS AND CLEANING SYSTEM FOR DISK-SHAPED OBJECTS USING SAME

BACKGROUND OF THE INVENTION

1. Field of the Invention

The present invention relates to a brush cleaning apparatus that efficiently cleans disk-shaped objects, for example, semiconductor wafers (hereafter simply referred to as wafer) and a cleaning system for the disk-shaped objects that uses the brush cleaning apparatus as a part thereof.

2. Description of the Prior Art

In semiconductor device fabrication processes, impurities and foreign matters adhered on the surface of a wafer, on which, for example, chemical impurities or particles are usually attached just after the wafer has been finished with a polishing process, have an adverse influence on the performance of semiconductor devices therefrom.

A cleaning operation is therefore indispensable in processes for producing wafers. And a variety of cleaning methods are available in the cleaning operation for a process for producing wafers, which are most broadly classified into the two groups of physical methods and chemical methods.

In the physical methods, included are a method in which impurities stuck on the surface of a wafer are directly removed by the mechanical action of a cleaning brush, another method in which a pressurized liquid is shot in a stream onto part or all of the surface of a wafer from a jet nozzle and thereby the impurities are removed off, and still another method in which impurities stuck on the surface of a wafer are removed off by application of ultrasonic wave energy in a condition that the wafer to be cleaned is immersed in a liquid, where ultrasonic wave is produced with a piezoelectric transducer installed under water.

In the chemical methods, impurities stuck on the surface of a wafer are chemically decomposed into constituents to be removed by the powers of chemicals or enzymes. In the meantime, both of the methods may be combined so as to improve the total cleaning capacity.

Among the above mentioned cleaning methods, the brush used cleaning method or simply brush cleaning method is effective in removing impurities such as particles attached on the surface of a wafer and therefore the brush cleaning method is well used in cleaning processes for wafers.

There is a traditional brush cleaning apparatus, which is cleaning both the surfaces of a wafer at a time with a pair of brushes, as the wafer is being turned about its center. In this type of brush cleaning apparatus, however, it takes a longer period of time for the whole surfaces of the wafer to be cleaned, since the peripheral area of either surface has a shorter period of time to contact with the brush than the central area and, what's worse, the very periphery and its neighbor are unfavorably restricted in cleaning action with necessity of mechanically supporting the wafer by the periphery in rotation thereof.

SUMMARY OF THE INVENTION

The present invention was made in view of the state of the prior art technology above-mentioned and has an object to provide a brush cleaning apparatus, which is capable of shortening the time of brush cleaning, making the mechanism of a related apparatus simpler and effectively cleaning the outermost periphery by eliminating supporting devices for supporting a disk-shaped object during brush cleaning, and a cleaning system for the disk-shaped objects using the same as a part thereof.

The brush cleaning apparatus according to the present invention has at least a brush cleaning means comprising a pair of rotary roller brushes, which are arranged in parallel and spaced apart in one above the other. The cleaning apparatus is operated in such a manner that the disk-shaped objects are transported through the pair of rotary roller brushes while being cleaned and may be used together with a stopper means, which is used for stoppage in place or discharge of the objects, located at a forward distance from the pair of the brushes in the moving direction of the circumferences of the brushes at the contact lines with the object.

The stopper means comprises a pair of stopper rods, which are spaced apart by a distance which is adjustable. When the pair of stopper rods are closed, or the space there between is so adjusted to open smaller in length than the diameter of the disk-shaped objects, the objects each are stopped to stay in a place and, to the contrary, the objects each are at a slow speed, which is adjustable, forwarded when the space between the pair of stopper rods is slowly enlarged. To discharge the objects from the apparatus, the space between the pair of stopper rods is adjusted to be larger than the diameter of the objects.

At least a pair of auxiliary rotary roller brushes may be installed at a close distance from the stopper means in the forward direction. The pair of brushes are arranged in parallel and spaced apart in one above the other. When the pair of stopper rods are moved apart so that the space therebetween is smaller than the diameter of the disk-shaped objects, a portion of the leading edge of the object is cleaned with the above mentioned auxiliary roller brush means. It is also possible that an auxiliary stopper means, which has the same construction as that of the stopper means as the main, is further installed for the similar purpose.

Semiconductor wafers are a general form as the disk-shaped objects and objects may naturally be cleaned with the brush cleaning apparatus according the present invention, as long as the objects are in the shape of a disk.

The above mentioned brush cleaning apparatus is applicable to a cleaning system for the objects comprising: a loader mechanism used for transportation of disk-shaped objects orderly accommodated within a carrier; a brush cleaning section, where the objects from the loader mechanism are cleaned; a rinse section, where the objects treated in the brush cleaning section are rinsed; a drying section, where the objects as rinsed are dried; and an unloader mechanism used for receiving the objects as dried in the drying section within a carrier.

The brush cleaning apparatus according to the present invention may include one or more of brush cleaning means arranged in parallel with each other in view of the fact that a required cleaning time is shorter, the larger the contacting area of a wafer with the brush cleaning means is. Further a stopper means comprising two stopper rods are located at a distance from the brush cleaning means in the moving direction of a portion of the circumferences of the roller brushes, where they contact with the wafer in brush cleaning. In the brush cleaning apparatus, transportation of wafers gets easier with adoption of a construction of opening the stopper means and further no traditional wafer supporting mechanism is required, which make it possible to simplify the construction of a brush cleaning apparatus. Still further it is made possible with the brush cleaning apparatus according to the present invention that the outermost periphery of a wafer is effectively cleaned.

BRIEF DESCRIPTION OF THE DRAWINGS

Other features and objects of the present invention will become apparent from a study of the following description of both a brush cleaning apparatus, which is capable of shortening the time of brush cleaning, making the mechanism of the apparatus simpler and cleaning the outermost periphery by eliminating supporting devices for supporting a disk-shaped object during brush cleaning, and a cleaning system for the disk-shaped objects using said brush cleaning apparatus as a part thereof, together with the accompanying drawings, of which.

DETAILED DESCRIPTION OF THE PREFERRED EMBODIMENTS

Below described in reference to FIGS. 1 and 2 is an embodiment of the present invention. Wafers are taken as a form of the disk-shaped objects to be cleaned in the embodiment.

FIGS. 1(a) to (d) are schematic plan views as seen from above, showing the cleaning action of a brush cleaning apparatus (10) according to the present invention. FIGS. 2(a) to (d) are the corresponding schematic side views of the cleaning action of FIGS. 1(a) to (d). The brush cleaning apparatus (10) according to the present invention is equipped with brush cleaning means 12A and 12B and an auxiliary brush cleaning means 12C, which are respectively constructed of two pair of rotary brushes 12a, 12a', 12b and 12b' and a pair of auxiliary brushes 12c and 12c' the brushes of each pair, auxiliary or not, being all spaced apart, face to face and one above the other. In the embodiments shown in FIGS. 3 and 4, two of the brush cleaning means 10A, 10B and a set of the auxiliary brush cleaning means 15A are included in the cleaning system 30, wherein a set of the brush cleaning apparatus may be used instead of two sets thereof.

The marks 18 and 20 indicate wafer guides arranged at the side ends of the brush cleaning apparatus 10.

The mark 22 is a stopper means to stop the forward movement of wafers W and disposed between the brush cleaning means 12B and the auxiliary brush cleaning means 12C. The stopper means 22 is composed of a pair of stopper rods 24, 24, which are so constructed as to be moved sideways by an opening and closing mechanism for the stopper rods, not shown. The stopper means 22 is thus controllably free to open or close.

The stopper rods 24, 24 have a critical position of the pair, where the space between the rods is usually set at about 0.95 times as large as the diameter of wafers to be cleaned. The stopper rods do not open beyond the critical position as long as a special instruction is not given.

The stopper rod opening and closing mechanism, not shown, act to open the space between the stopper rods beyond the critical position so that the wafer W is released from the stop position, according to an instruction from a stopper control means C, only when a sensor S installed in the next section recognizes there being no wafer therein. Thereby, destruction of wafers through inadvertent contacts with each other is effectively prevented.

The marks 26, 28 indicate shower heads for cleaning liquid supply, installed respectively above and below both the brush cleaning means 12A, 12B and the auxiliary brush cleaning means 12C.

According to the above mentioned construction, a wafer W is led by the wafer guides 18, 20, while it is driven to proceed by rotation of the brushes in the moving direction (in the right direction as viewed in the example of the drawings) of the peripheral portions of the rotary roller brushes 12a, 12a', 12b, 12b', where the brushes are to contact the wafer in operation. The transferring wafer W is stopped at the stopper rods 24, 24 in the closing state (hereafter the moving direction of the peripheral portion particularly indicated above is simply referred to as simply rotational direction or rotational direction of the brushes).

Next, the wafer W is slowly being moved in the rotational direction (in the right direction as viewed in the example of the drawings), as the stopper rods 24, 24 are slowly opening. When it is confirmed that the wafer is fully cleaned, for instance, after a proper time is passed and besides no wafer remains in the next section by means of a sensor S, an instruction is transmitted from the stopper control means C to actuate the stopper rod opening and closing mechanism and thereby open the stopper rods 24, 24 beyond the critical position, so that the wafer W is released from the stop state and further forwarded to the next section for another treatment.

In the state where a wafer W is kept in stoppage or slowly being transported in the forward direction, the front and back surfaces of the wafer W are both being cleaned by means of the brush cleaning means 12A, 12B and the auxiliary brush cleaning means 12C in the presence of a cleaning liquid supplied from cleaning liquid supply nozzles 26, 28. When the leading tip of the wafer W protrudes beyond the imaginary line passing the forward side of the stopper rods 24, 24 in the process of slowly opening thereof, the auxiliary brush cleaning means 12C gives an additional cleaning action on the leading tip of the wafer W, since the leading tip would otherwise receive a lesser cleaning effect as compared to other areas of the wafer.

The cleaning time of the wafer W is free to be adjustable, by adjusting the speed of change in magnitude of the spacing of the stopper rods 24 by a stopper rod opening and closing mechanism, not shown, with instructions from the stopper control means C. The stopper rods 24, 24 are moved back to the closing condition, after the wafer W is fully moved out to the next section, in which state they 24, 24 are awaiting another wafer.

In the above mentioned embodiment, the brush cleaning apparatus is composed of the brush cleaning means 12A, 12B and the auxiliary brush cleaning means 12C. However, there may be conceivable a brush cleaning 10, which is composed of the brush cleaning means 12A, 12B only, while an auxiliary brush cleaning means 12C may be installed at a different position from the above case in the same cleaning system for disk-shaped objects.

The brush cleaning apparatus 10 is usually used as a part built in a cleaning system for disk-shaped objects such as wafers. The following description is to explain an example of a cleaning system for disk-shaped objects with the brush cleaning apparatus built therein in reference to FIGS. 3 to 6.

Figure 1A:
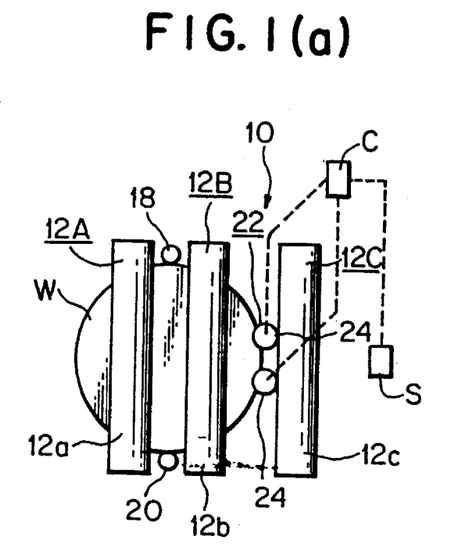
FIGS. 1(a) to 1(d) includes schematic plan views, in which the action of a brush cleaning apparatus according to the present invention is represented as seen from above.
Figure 1B:
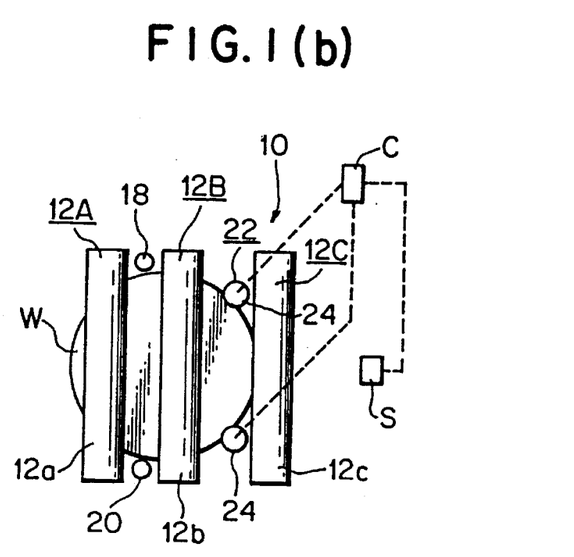
Figure 1C:
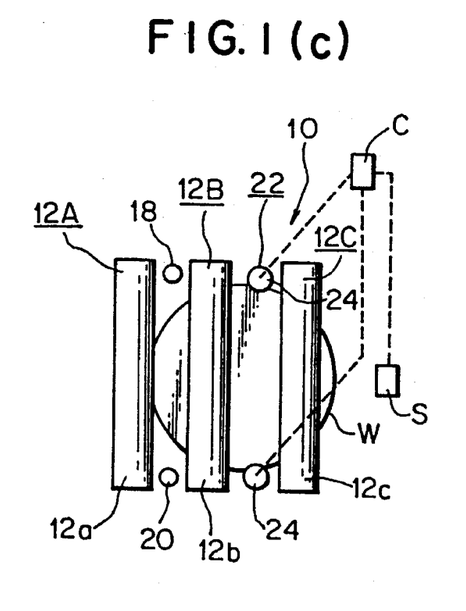
Figure 1D:
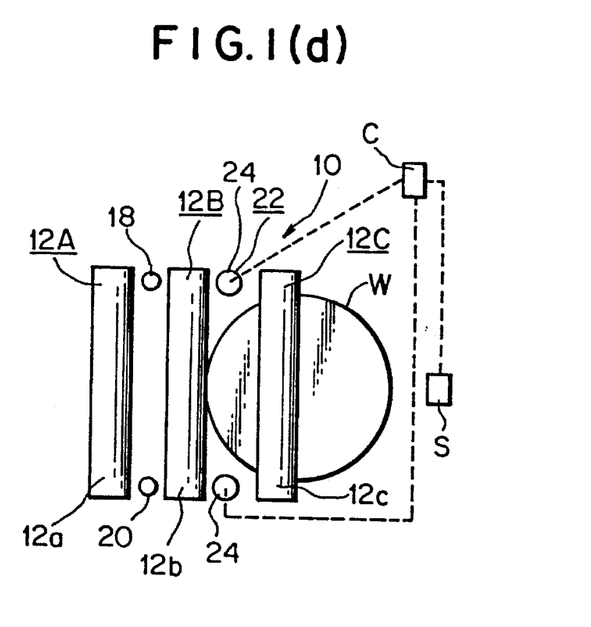
Figure 2A:
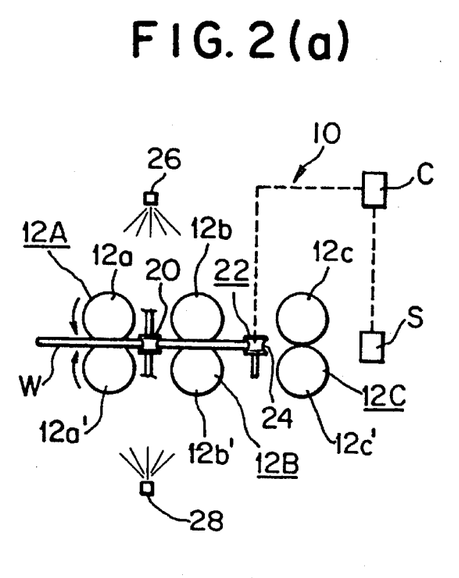
FIGS. 2(a) to 2(d) includes schematic side views of the cleaning action of FIG. 1 as seen from the side.
Figure 2B:
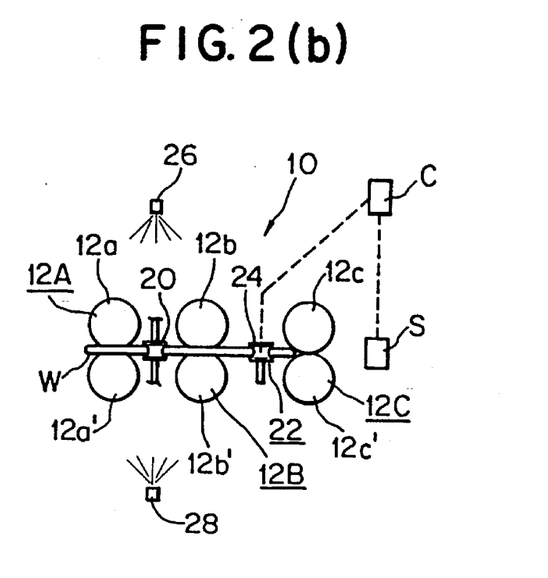
Figure 2C:
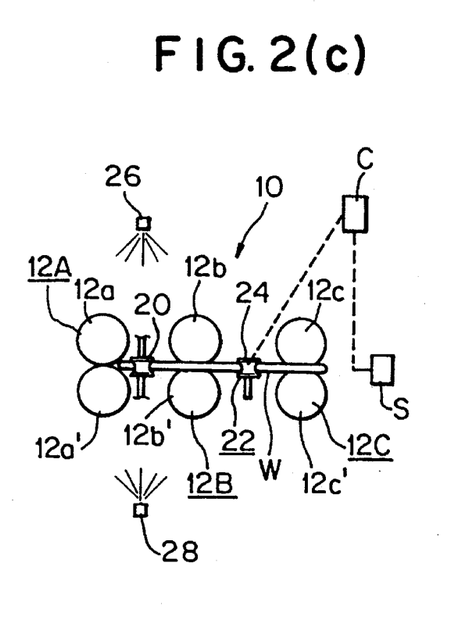
Figure 2D:
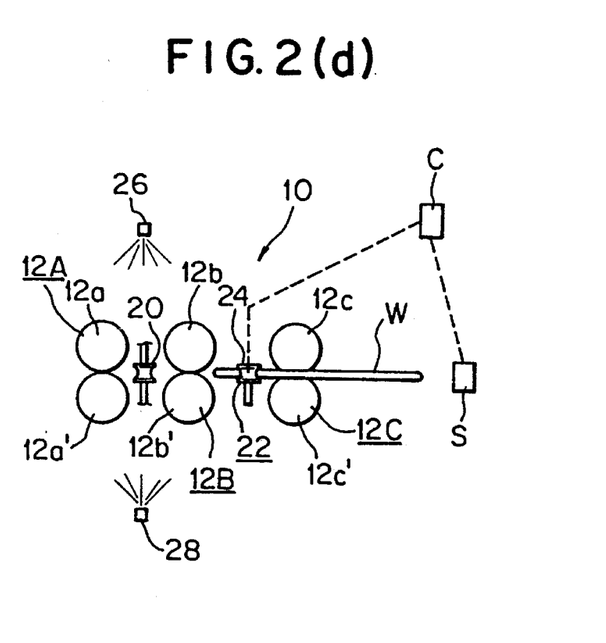
Figure 3:
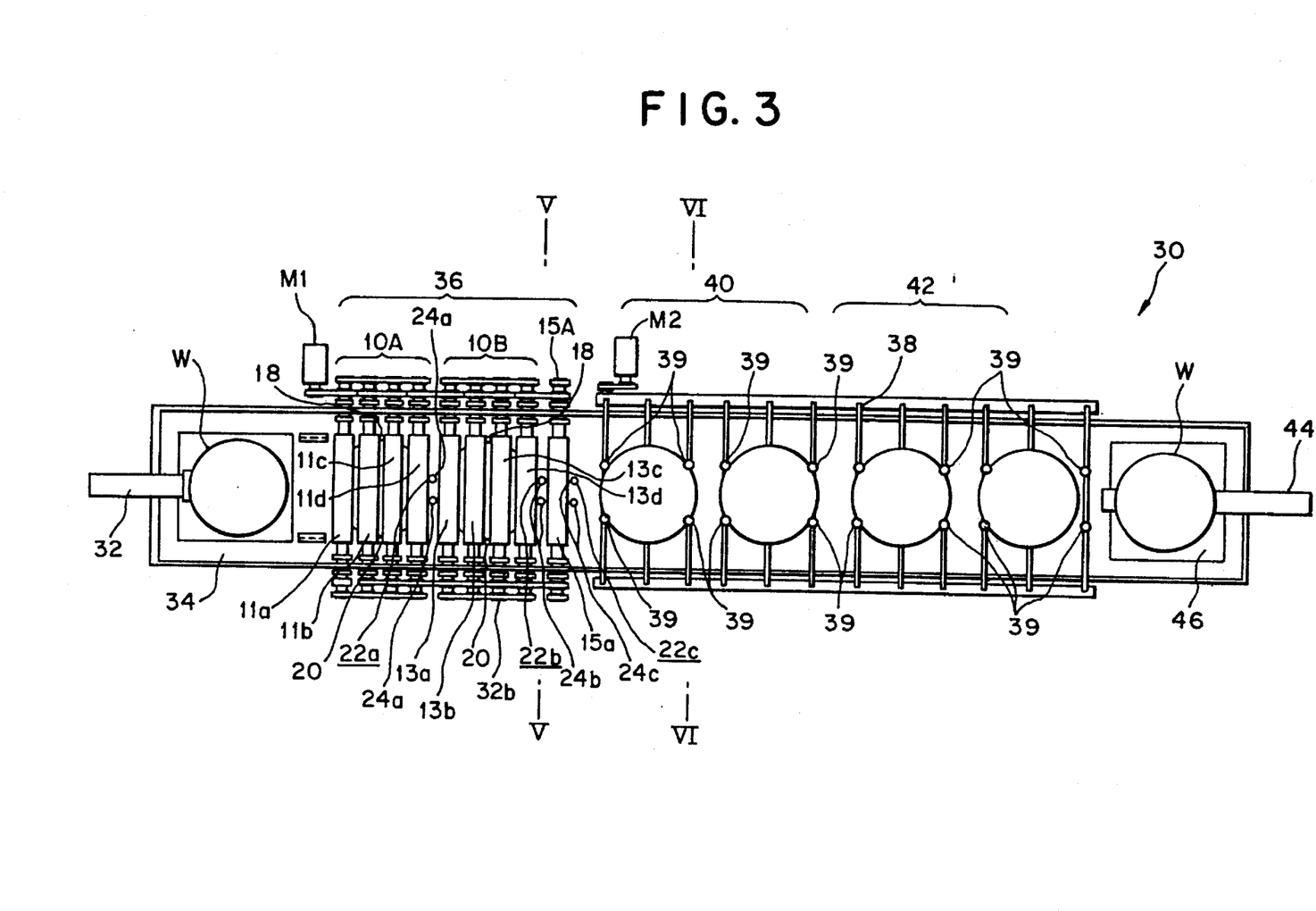
FIG. 3 is a schematic plan view showing a cleaning system for disk-shaped objects comprising two units of the brush cleaning apparatus according to the present invention.

FIG. 3 is a schematic plan view showing a cleaning system for disk-shaped objects (which are wafers in this case of the drawing) comprising two units of the brush cleaning apparatus according to the present invention.

Figure 4:
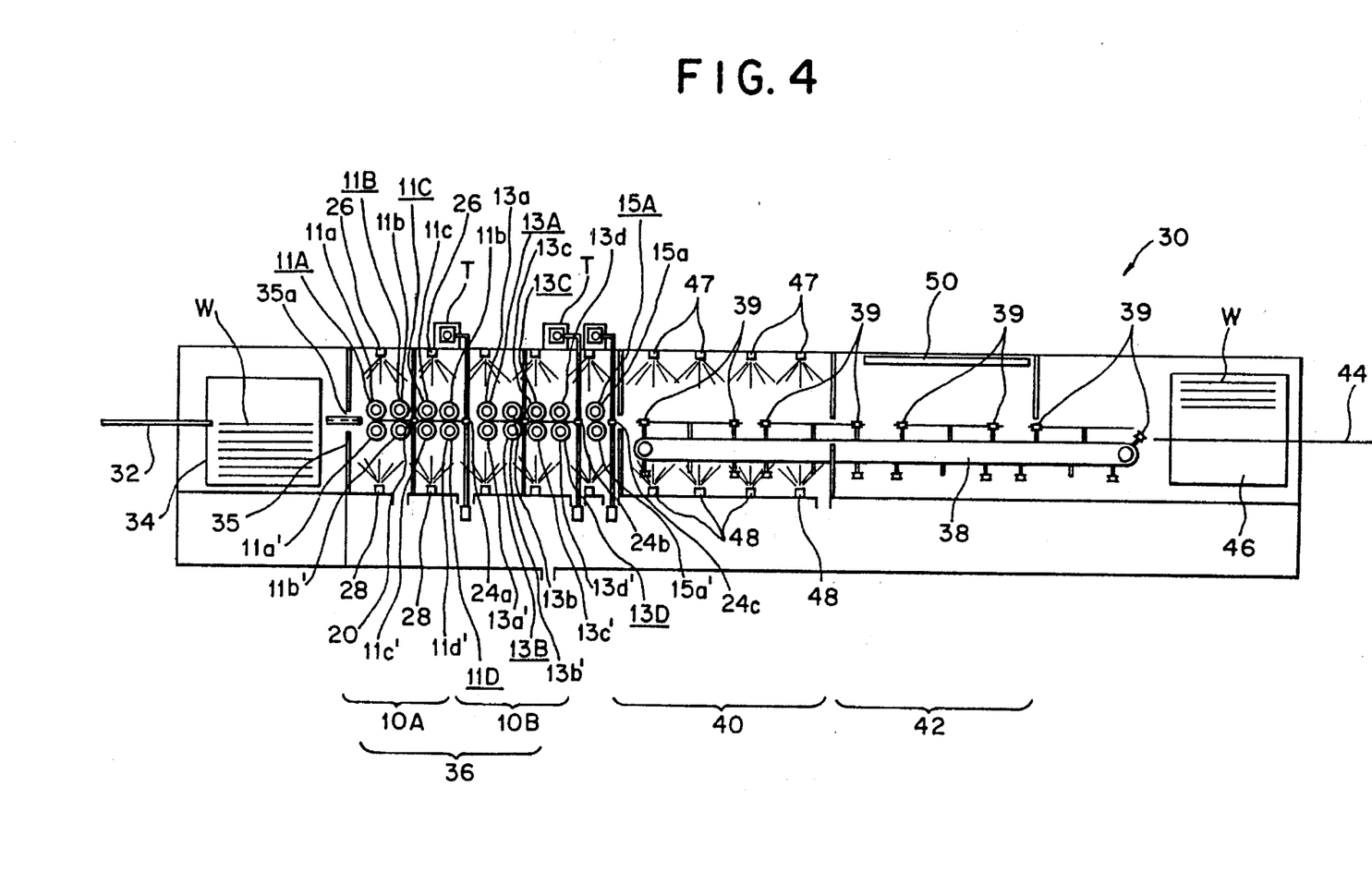
FIG. 4 is a schematic side view of FIG. 3.
Figure 5:
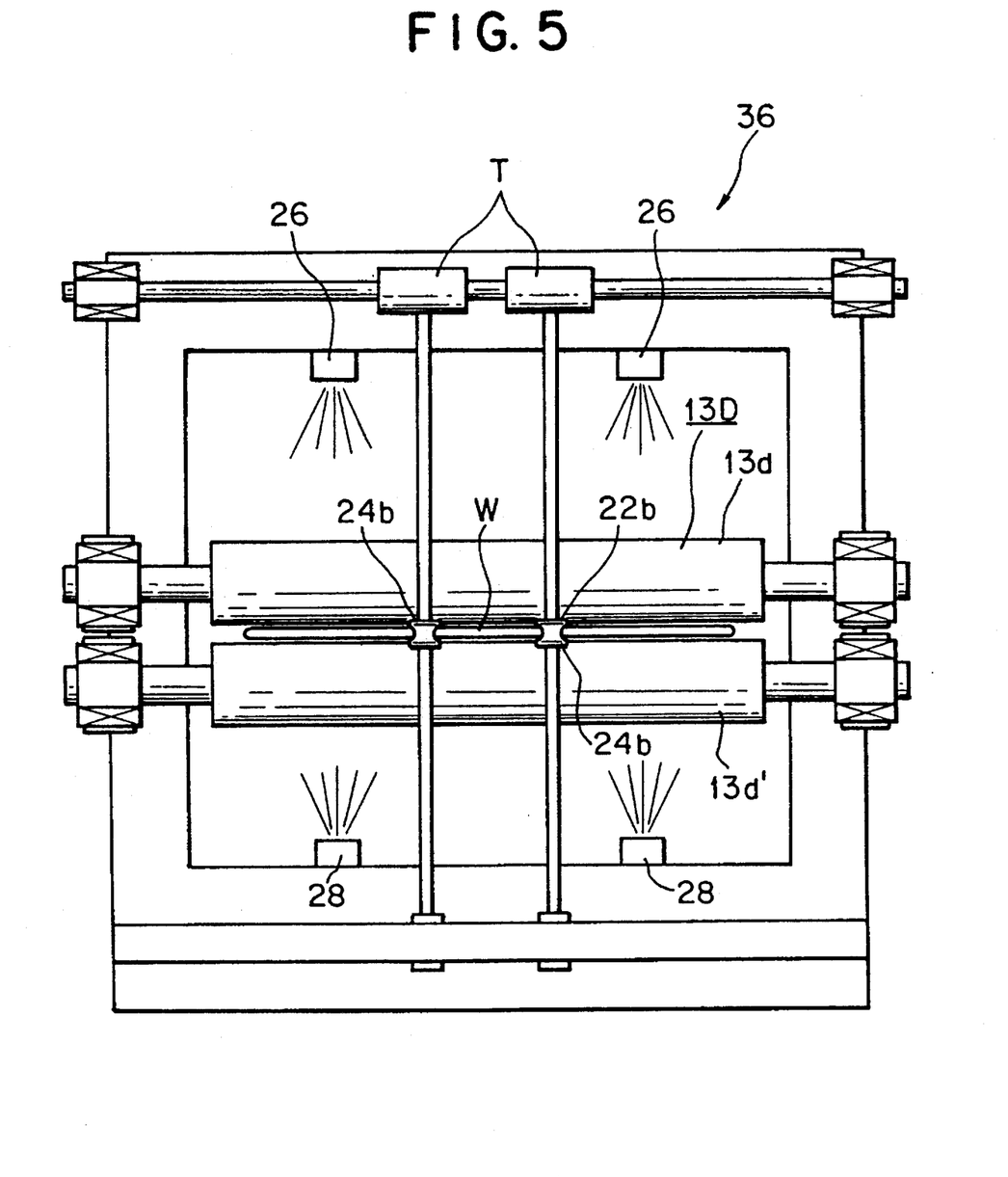
FIG. 5 is a sectional view taken on line V—V of FIG. 3.
Figure 6:
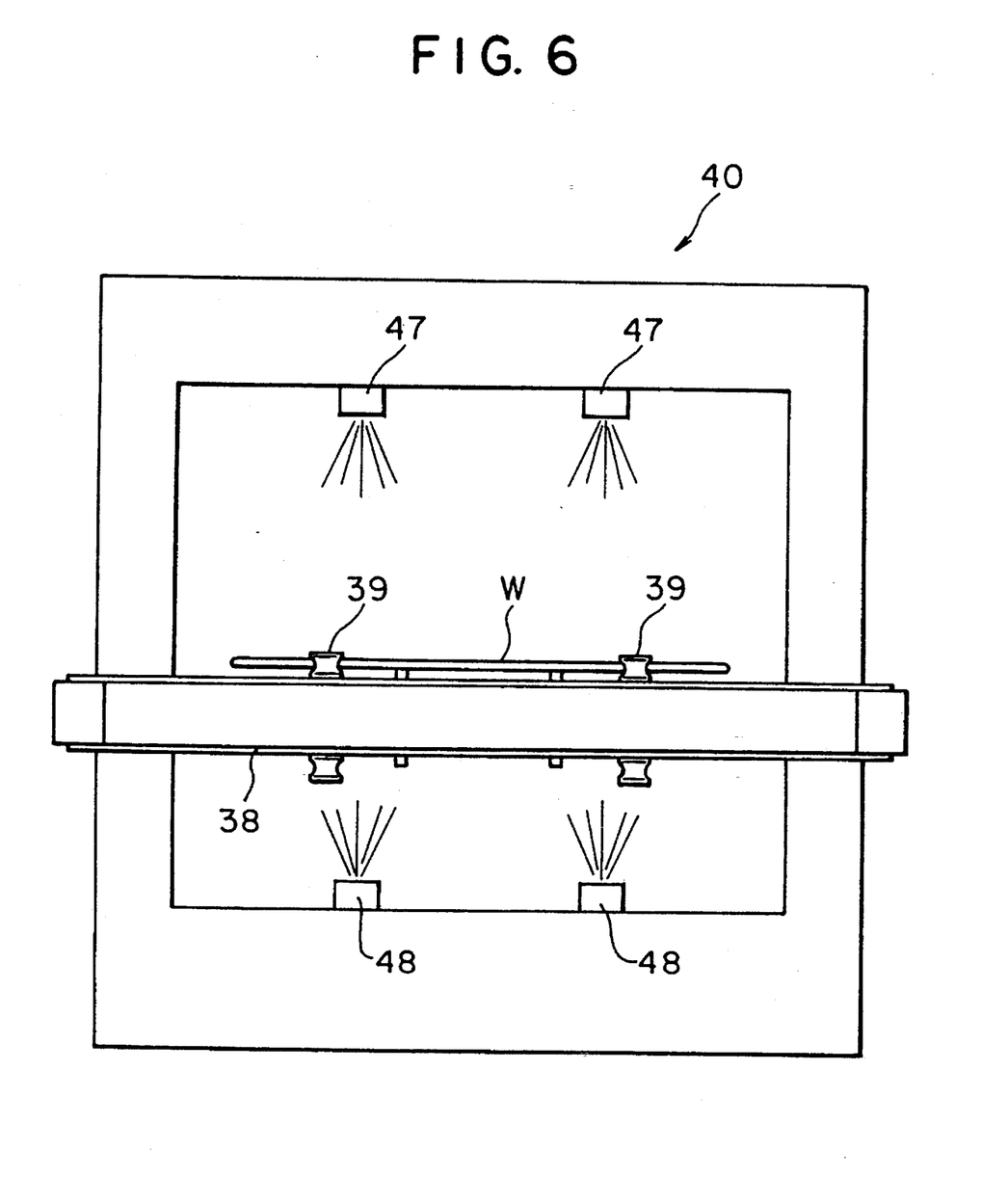
FIG. 6 is a sectional view taken on line VI—VI of FIG. 3.

FIG. 4 is a schematic side view of FIG. 3. FIG. 5 is a sectional view taken on line V—V of FIG. 3. FIG. 6 is a sectional view taken on line VI—VI of FIG. 3.

In cleaning system 30 shown in FIGS. 3 and 4 which includes two sets of the brush cleaning apparatus according to the present invention mark 32 indicates a wafer loader mechanism, in which wafers W are taken out one by one from a supply carrier 34 containing the wafers W by way of a supply slit 35a of a partition 35 and supplied to a brush cleaning section 36. The brush cleaning section 36 has a plurality of the brush cleaning apparatuses 10 mentioned above.

In the example of FIGS. 3 and 4, the brush cleaning section 36 is composed of: a first brush cleaning apparatus 10A having four brush cleaning means 11A, 11B, 11C, and 11D, which are further respectively composed of pairs of rotary brushes 11a, 11a'; 11b, 11b'; 11c, 11c' and 11d, 11d'; a second brush cleaning apparatus 10B having four brush cleaning means 13A, 13B, 13C and 13D, which are further respectively composed of pairs of rotary brushes 13a, 13a'; 13b, 13b'; 13c, 13c' and 13d, 13d'; and an auxiliary brush cleaning means 15A having a pair of auxiliary rotary brushes 15a, 15a'.

In the embodiment shown in FIGS. 3 and 4, three stopper means are installed, which are a first stopper means 22a disposed after a first brush cleaning apparatus 10A, a second stopper means 22b disposed after a second brush cleaning apparatus 10B and an auxiliary stopper means 22c after an auxiliary brush cleaning means 15A.

The first, second and auxiliary stopper means 22a, 22b and 22c are respectively composed of pairs of the first stopper rods 24a, the second stopper rods 24b, and the auxiliary stopper rods 24c. A stopper rod opening and closing mechanism T controls the respective movements and positions of the stopper rods 24a, 24a, 24b, 24b and 24c, 24c.

In the mean time, the sensor S and stopper control means C shown in FIGS. 1 and 2 are omitted in the embodiment shown in FIGS. 3 and 4, but they are actually equipped to the embodiment. The stopper rod opening and closing mechanism T is electrically connected to the stopper control means C and is actuated to open or close the stopper rods by instructions transmitted from the stopper control means C as is explained in FIGS. 1 and 2.

Sensors, not shown, are installed in the respective sections following the stopper means 22a, 22b and 22c to detect the existence of wafers within the respective sections. The sensors are electrically connected to the stopper control means C and give proper instructions to close fully or partly each pair of the stopper rods, where the respective pairs of the stopper rods 24a, 24a; 24b, 24b and 24c, 24c do not open fully or stay closed to confine wafers within the sections themselves, if wafers are confirmed to remain in the following sections.

The mark 38 indicates a wafer transportation belt mechanism having wafer holding members 39 mounted thereon. The wafer transportation belt mechanism 38 transports the wafer W as cleaned from the brush cleaning section 36, to a rinse section 40 equipped with supply nozzles 47, 48 for rinse liquid and further to a drying section 42 equipped with IR lamps 50. The dried wafers are taken in a receiving carrier 46 by means of a wafer unloader mechanism 44.

In the mean time, M1 indicates a motor for driving the brush cleaning apparatuses 10A and 10B and M2 indicates another motor for driving the wafer transportation belt mechanism 38.

The actions of each of the parts in the construction of the cleaning system for disk-shaped objects are described below: Firstly a plurality of wafers W are set within the supply carrier 34. The wafers are fed to the brush cleaning section 36 one by one from the carrier 34, when the wafers W are led to a proper position in the brush cleaning section 36 by the wafer guides 18, 20 with certainty. The wafers are each forwarded by the wafer loader mechanism 32 and the frictional force created by rotation of the pairs of rotary brushes 11a, 11a'; 11b, 11b'; 11c, 11c' and 11d, 11d' and stopped at a position after a small travel, where the wafer is physically stopped by the first stopper rods 24a, 24a in the close condition. Then, the first stopper rods 24a, 24a are slowly being opened by means of the action of the stopper rod opening and closing mechanism T, which is originally actuated by an instruction transmitted from the stopper control means, not shown. The leading tip of the wafer W is being protruded beyond the imaginary line passing the right sides of the stopper rods 24a, 24a when the spacing between the stopper rod is enlarged.

When the first stopper rods 24a, 24a are opened to a full extent, the wafer W is released from the restriction of the stopping action to then proceed to the next section, where the speed of opening of the stopper rods 24a, 24a is adjusted so as for the wafer to be effectively cleaned across the surfaces thereof. The cleaning action is realized by the frictional force of the brushes on the surfaces of a wafer W, being caused by the difference between the forwarding speed of the wafer W and the circumferential speed of the brushes. On the other hand, when the wafer stays in the stop state or in the slowly moving condition, it is cleaned across both surfaces by brushing action of the brush cleaning means 11A–11D in the presence of a cleaning liquid supplied from the cleaning liquid supply nozzles 26 and 28.

When the leading tip of the wafer W passes, beyond the extent of cleaning under command of the brush cleaning means 11D according as the first stopper rods 24a, 24a is opening slowly, the brush cleaning means 13A of the second brush cleaning apparatus 10B begins to clean the leading tip of the wafer W in such a manner that the leading tip receives the same degree of cleaning action as other areas of the wafer.

The wafer W is moved out the first brush cleaning apparatus 10A and then is cleaned by the second brush cleaning apparatus 10B, when the stopper rods 24b, 24b stop in place to clean the wafer W by the brushes as done in the first brush cleaning apparatus 10A.

When the second stopper rods 24b, 24b are slowly opening until the leading tip of the wafer W is protruded beyond the imaginary line passing the right sides thereof, so that it is moved out of the cleaning extent, if anything, under command of the brush cleaning means 13D, the auxiliary brush cleaning means 15A completes cleaning of the leading tip of the wafer W not to level down as compared with the other area.

The role of the auxiliary brush cleaning means 15A is to clean especially the leading tip of a wafer W protruded beyond the cleaning extent under control of the brush cleaning apparatus 10B while adjusting the forwarding speed of the wafer W and the role of the auxiliary stopper rods 24c, 24c is to make the wafer stay in place during cleaning action on the leading tip so as not to move out to the next section, when the next section is occupied with another wafer W in another process. Consequently, if there is confirmed no wafer W in the next section, after the auxiliary cleaning is finished, the auxiliary stopper rods 24c, 24c are fully opened to move the wafer out to the next section for another process.

Each of the stopper rods 24a, 24a; 24b, 24b and 24c, 24c are closed after confirmation of the wafer's discharge.

The wafer finished with both cleaning processes by the brush cleaning apparatus 10B and the auxiliary brush cleaning apparatus 15A is being moved in the space of the rinse section 40 at a constant speed, as they are put between wafer holding members 39 for supporting, which are mounted to the wafer transportation belt mechanism 38. During this transportation, the wafer W is rinsed across both of the surfaces with the rinse liquid supplied from the rinse supply nozzles 47, 48.

The wafer W as rinsed is further passed through the space of the drying section 42 equipped with IR lamps to dry them. The dried wafer W is received into the receiving carrier 46 by means of the wafer unloader mechanism 44 in the same way as the other wafers are received.

As described before, in the brush cleaning apparatus 10, 10A according to the present invention, a brush cleaning time is decreased by increasing the number of sets of the brush cleaning means 12A, 12B, 11A, 11B, the cleaning time of disk-shaped objects W or wafers is free to be adjustable by disposing stopper means 22, 22a in the rotation direction of the brushes 12a, 12a', 11a, 11a', the outermost area of the wafer W is fully cleaned as well by virtue of the stopper means 22, 22a and further the cleaning efficiency. 0f a cleaning system for disk-shaded objects W may be increased by building the brush cleaning apparatus 10, 10A therein.

What is claimed is:

1. A brush cleaning apparatus comprising: a plurality of brush cleaning means for transporting and cleaning disk-shaped objects one at a time between a pair of brushes, each of said brush cleaning means comprising a pair of rotary brushes arranged in parallel one above the other, guides for guiding the disk-shaped objects during cleaning, said guides being arranged perpendicular to axes of the rotary brushes and adjacent the rotary brushes, and a stopper means for blocking movement of the disk-shaped objects and releasing the disk-shaped objects for movement along a transport direction perpendicular to the axes of the rotary brushes, said stopper means being located at a distance from the brush cleaning means along the transport direction, said stopper means including a pair of stopper rods, a spacing between said pair of stopper rods being adjustable, whereby the disk-shaped objects are transported at a speed during cleaning, which speed is controlled by adjusting a rate of change in magnitude of the spacing between the stopper rods.

2. The brush cleaning apparatus as defined in claim 1, further comprising at least one auxiliary brush cleaning means for cleaning a leading tip of each disk-shaped object, said at least one auxiliary brush cleaning means including a pair of auxiliary rotary brushes arranged in parallel one above the other and located at a distance from the stopper means along the transport direction of the disk-shaped objects.

3. The brush cleaning apparatus as defined in claim 2, further comprising an auxiliary stopper means for blocking movement of the disk-shaped objects and releasing the disk-shaped objects for movement along the transport direction, said auxiliary stopper means being located at a distance from the at least one auxiliary brush cleaning means along the transport direction of the disk-shaped objects.

4. The brush cleaning apparatus as defined in claim 3, wherein said auxiliary stopper means comprises a pair of auxiliary stopper rods, a spacing between said pair of auxiliary stopper rods being adjustable, whereby a disk-shaped object is stopped in place when the space between the pair of the stopper rods is smaller than the diameter of the disk-shaped object, the disk-shaped object is slowly moved forward as the space between the pair of stopper rods is slowly increased, and the disk-shaped object is moved out of the apparatus when the space between the pair of stopper rods is larger the diameter of the disk-shaped object.

5. The brush cleaning apparatus as defined in claim 4, wherein said disk-shaped objects are semiconductor wafers.

6. The brush cleaning apparatus as defined in claim 1, wherein said disk-shaped objects are semiconductor wafers.

7. The brush cleaning apparatus as defined in claim 2, wherein said disk-shaped objects are semiconductor wafers.

8. The brush cleaning apparatus as defined in claim 3, wherein said disk-shaped objects are semiconductor wafers.

9. A cleaning system for disk-shaped objects comprising:
a carrier for accommodating disk-shaped objects therein;
a loader mechanism for loading the disk-shaped objects one by one from the carrier to brush cleaning sections of the cleaning system in which the disk-shaped objects are cleaned, said brash cleaning sections being directly located next to the loader mechanism;
rinse sections for rinsing disk-shaped objects cleaned in the brash cleaning sections;
drying sections for drying disk-shaped objects rinsed in the rinse sections;
an unloader mechanism for receiving the disk-shaped objects from the drying section and placing said disk-shaped objects into another carrier; and
a disk-shaped object transportation belt mechanism for transporting the disk-shaped objects between the brash cleaning sections, the rinse sections, and the drying sections,
wherein each of the brash cleaning sections comprises a plurality of brash cleaning means for transporting and cleaning disk-shaped objects one by one between pairs of brushes, each of the brush cleaning means comprising:
a pair of rotary brushes arranged in parallel one above the other,
guides for guiding the disk-shaped objects during cleaning, said guides being arranged perpendicular to axes of the rotary brushes and adjacent the rotary brushes, and
a stopper means for blocking movement of the disk-shaped objects and releasing the disk-shaped objects for movement along a transportation direction, the stopper means being located at a distance from the brush cleaning means along the transportation direction and perpendicularly to the axes of the rotary brushes, said stopper means including a pair of stopper rods, a spacing between said pair of stopper rods being adjustable, whereby the disk-shaped objects are advanced along the transportation direction at a speed which speed is controlled by adjusting a rate of change in magnitude of the spacing of the stopper rods.

10. A cleaning system for disk-shaped objects as defined in claim 9, further comprising an auxiliary stopper means for blocking movement of the disk-shaped objects and releasing the disk-shaped objects for movement along the transportation direction, said auxiliary stopper means being located at a distance from at least one auxiliary brush cleaning means in the transportation direction of the objects.

11. A cleaning system for disk-shaped objects comprising:

a carrier for accommodating disk-shaped objects therein;

a loader mechanism for loading the disk-shaped objects one by one from the carrier to brush cleaning sections of the cleaning system in which the disk-shaped objects are cleaned, said brush cleaning sections being directly located next to the loader mechanism;

rinse sections for rinsing disk-shaped objects cleaned in the brush cleaning sections;

drying sections for drying disk-shaped objects rinsed in the rinse sections;

an unloader mechanism for receiving the disk-shaped objects from the drying section and placing said disk-shaped objects into another carrier;

a disk-shaped object transportation belt mechanism for transporting the disk-shaped objects between the brash cleaning sections, the rinse sections, and the drying sections, wherein each of the brash cleaning sections comprises: a plurality of brash cleaning means for transporting and cleaning disk-shaped objects one by one between pairs of brushes, each of the brush cleaning means comprising:

a pair of rotary brushes arranged in parallel one above the other, guides for guiding the disk-shaped objects during cleaning, said guides being arranged perpendicular to axes of the rotary brushes and adjacent the rotary brushes, and a stopper means for blocking movement of the disk-shaped objects and releasing the disk-shaped objects for movement along a transportation direction, the stopper means being located at a distance from the brash cleaning means along the transportation direction and perpendicularly to the axes of the rotary brushes, said stopper means including a pair of stopper rods, a spacing between said pair of stopper rods being adjustable, whereby the disk-shaped objects are advanced along the transportation direction at a speed which speed is controlled by adjusting a rate of change in magnitude of the spacing of the stopper rods; and at least one auxiliary brash cleaning means for cleaning a leading tip of each disk-shaped object, said at least one auxiliary brash cleaning means including a pair of auxiliary rotary brushes arranged in parallel one above the other and located at a distance from the stopper means along the transportation direction of the disk-shaped objects.

12. A cleaning system for disk-shaped objects as defined in claim 11, further comprising an auxiliary stopper means for blocking movement of the disk-shaped objects and releasing the disk-shaped objects for movement along the transportation direction, said auxiliary stopper means being located at a distance from at least one auxiliary brush cleaning means in the transportation direction of the disk shaped objects.

13. A cleaning system for disk-shaped objects comprising:

a carrier for accommodating disk-shaped objects therein;

a loader mechanism for loading the disk-shaped objects one by one from the carrier to brush cleaning sections of the cleaning system in which the disk-shaped objects are cleaned, said brush cleaning sections being directly located next to the loader mechanism;

rinse sections for rinsing disk-shaped objects cleaned in the brush cleaning sections;

drying sections for drying disk-shaped objects rinsed in the rinse sections;

an unloader mechanism for receiving the disk-shaped objects from the drying section and placing said disk-shaped objects into another carrier;

a disk-shaped object transportation belt mechanism for transporting the disk-shaped objects between the brush cleaning sections, the rinse sections, and the drying sections, wherein each of the brush cleaning sections comprises: a plurality of brush cleaning means for transporting and cleaning disk-shaped objects one by one between pairs of brushes, each of the brush cleaning means comprising:

a pair of rotary brushes arranged in parallel one above the other, disk-shaped object guides for guiding the disk-shaped objects during cleaning, said disk-shaped object guides being arranged perpendicular to axes of the rotary brushes and adjacent the rotary brushes, and a stopper means for blocking movement of the disk-shaped objects and releasing the disk-shaped objects for movement along a transportation direction, the stopper means being located at a distance from the brush cleaning means along the transportation direction and perpendicularly to the axes of the rotary brushes, said stopper means including a pair of stopper rods, a spacing between said pair of stopper rods being adjustable, whereby the disk-shaped objects are advanced along the transportation direction at a speed which speed is controlled by adjusting a rate of change in magnitude of the spacing of the stopper rods; and an auxiliary stopper means for blocking movement of the disk-shaped objects and releasing the disk-shaped objects for movement along the transportation direction, said auxiliary stopper means being located at a distance from the at least one auxiliary brush cleaning means along the transportation direction of the disk-shaped objects.

14. A cleaning system for disk-shaped objects as defined in claim 13, wherein said auxiliary stopper means comprising a pair of auxiliary stopper rods, a spacing between said pair of auxiliary stopper rods being adjustable, whereby a disk-shaped object is stopped in place when the space between the pair of the stopper rods is smaller than the diameter of the disk-shaped object, the disk-shaped object is slowly moved forward as the spaced between the pair of stopper rods is slowly increased, and the disk-shaped object is moved out of the apparatus when the space between the pair of stopper rods is larger the diameter of the disk-shaped object.

15. A cleaning system for disk-shaped objects comprising:

a carrier for accommodating disk-shaped objects therein;

a loader mechanism for loading the disk-shaped objects one by one from the carrier to brush cleaning sections of the cleaning system in which the disk-shaped objects are cleaned, said brush cleaning sections being directly located next to the loader mechanism;

rinse sections for rinsing disk-shaped objects cleaned in the brush cleaning sections;

drying sections for drying disk-shaped objects rinsed in the rinse sections;

an unloader mechanism for receiving the disk-shaped objects from the drying section and placing said disk-shaped objects into another carrier; and a disk-shaped object transportation belt mechanism for transporting the disk-shaped objects between the brush cleaning sections, the rinse sections, and the drying sections, wherein each of the brush cleaning sections comprises a plurality of brush cleaning means for transporting and cleaning disk-shaped objects one by one between pairs of brushes, each of the brush cleaning means comprising:

a pair of rotary brushes arranged in parallel one above the other, disk-shaped object guides for guiding the disk-shaped objects during cleaning, said disk-shaped object guides being arranged perpendicular to axes of the rotary brushes and adjacent the rotary brushes, and a stopper means for blocking movement of the disk-shaped objects and releasing the disk-shaped objects for movement along a transportation direction, the stopper means being located at a distance from the brush cleaning means alone the transportation direction and perpendicularly to the axes of the rotary brushes, said stopper means including a pair of stopper rods, a spacing between said pair of stopper rods being adjustable, whereby the disk-shaped objects are advanced along the transportation direction at a speed which speed is controlled by adjusting a rate of change in magnitude of the spacing of the stopper rods; and an auxiliary stopper means for blocking movement of the disk-shaped objects and releasing the disk-shaped objects for movement along the transportation direction, said auxiliary stopper means being located at a distance from at least one auxiliary brush cleaning means in the transportation direction of the disk shaped objects, said auxiliary stopper means comprising a pair of auxiliary stopper rods, a spacing between said pair of auxiliary stopper rods being adjustable, whereby a disk-shaped object is stopped in place when the space between the pair of the stopper rods is smaller than the diameter of the disk-shaped object, the disk-shaped object is slowly moved forward as the spaced between the pair of stopper rods is slowly increased, and the disk-shaped object is moved out of the apparatus when the space between the pair of stopper rods is larger the diameter of the disk-shaped object.

* * * * *